(12) United States Patent  (10) Patent No.: US 7,719,087 B2
Suzuki  (45) Date of Patent: May 18, 2010

(54) SEMICONDUCTOR DEVICE

(75) Inventor: Satoshi Suzuki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 70 days.

(21) Appl. No.: 12/260,494

(22) Filed: Oct. 29, 2008

(65) Prior Publication Data
US 2010/0007003 A1 Jan. 14, 2010

(30) Foreign Application Priority Data
Jul. 9, 2008 (JP) ............................. 2008-179207

(51) Int. Cl.
H01L 27/082 (2006.01)
H01L 21/8249 (2006.01)
H01L 21/331 (2006.01)
(52) U.S. Cl. .................... 257/565; 257/573; 257/584; 257/E21.383; 257/E27.074; 257/E27.055; 438/235; 438/309; 438/312; 326/18; 326/42; 326/75
(58) Field of Classification Search ................ 257/565, 257/571–573, 584, E21.383, E27.074, E27.055; 438/234, 235, 309, 312, 327, 336; 326/18, 326/42, 75, 89
See application file for complete search history.

(56) References Cited

U.S. PATENT DOCUMENTS 6,825,508 B2 * 11/2004 Fujita et al. ............... 257/197
7,364,977 B2 *  4/2008 Min et al. .................. 438/312

FOREIGN PATENT DOCUMENTS

JP  60-167432 A  8/1985

* cited by examiner

Primary Examiner—Hsien-ming Lee
(74) Attorney, Agent, or Firm—Leydig, Voit & Mayer, Ltd.

(57) ABSTRACT

A semiconductor device includes: a GaAs chip; and a resin sealing the GaAs chip. The GaAs chip includes: a p-type GaAs layer; an n-type GaAs layer on the p-type GaAs layer; a metal electrode located on the n-type GaAs layer along an edge of the GaAs chip and to which a positive voltage is applied; a device region located in a central portion of the GaAs chip; a semi-insulating region located between the metal electrode and the device region and extending in the p-type GaAs layer and the n-type GaAs layer; and a connecting portion disposed outside the semi-insulating region and electrically connecting the p-type GaAs layer to the metal electrode.

2 Claims, 4 Drawing Sheets

SEMICONDUCTOR DEVICE

BACKGROUND OF THE INVENTION

1. Field of the Invention

The present invention relates to a semiconductor device in which a GaAs chip is sealed or encapsulated with a resin, and more particularly to a semiconductor device in which such a GaAs chip has improved moisture resistance.

2. Background Art

There have been proposed resin sealed semiconductor devices in which a semiconductor chip is sealed with a resin [see, e.g., Japanese Laid-Open Patent Publication No. 60-167432 (1985)]. An exemplary such resin sealed semiconductor device includes a GaAs chip as the semiconductor chip. Electrodes are formed along the edges of the GaAs chip, and the device region is formed in the central portion of the GaAs chip.

SUMMARY OF THE INVENTION

These resin sealed semiconductor devices are disadvantageous in that, in a high temperature and high humidity environment, moisture tends to penetrate into the inside of the devices through the surface of the resin or along the interface between the resin and the printed circuit board on which the GaAs chip is mounted. It has happened that this penetration of moisture has caused oxidation of the surface of the GaAs chip around the metal electrodes (to which a positive voltage is applied) and around the device region, resulting in degradation and malfunction of the device.

The present invention has been devised to solve the above problems. It is, therefore, an object of the present invention to provide a semiconductor device whose GaAs chip has improved moisture resistance.

According to one aspect of the present invention, a semiconductor device comprises: a GaAs chip; and a resin sealing said GaAs chip; wherein said GaAs chip includes: a p-type GaAs layer; an n-type GaAs layer formed on said p-type GaAs layer; a metal electrode formed on said n-type GaAs layer along an edge of said GaAs chip and having a positive voltage applied thereto; a device region formed in a central portion of said GaAs chip; a semi-insulating region formed between said metal electrode and said device region and extending in said p-type GaAs layer and said n-type GaAs layer; and a connecting portion disposed outside said semi-insulating region and electrically connecting said p-type GaAs layer to said metal electrode.

Thus the present invention enables an increase in the moisture resistance of the GaAs chip of a semiconductor device.

Other and further objects, features and advantages of the invention will appear more fully from the following description.

DETAILED DESCRIPTION OF THE PREFERRED EMBODIMENTS

First Embodiment

Figure 1:
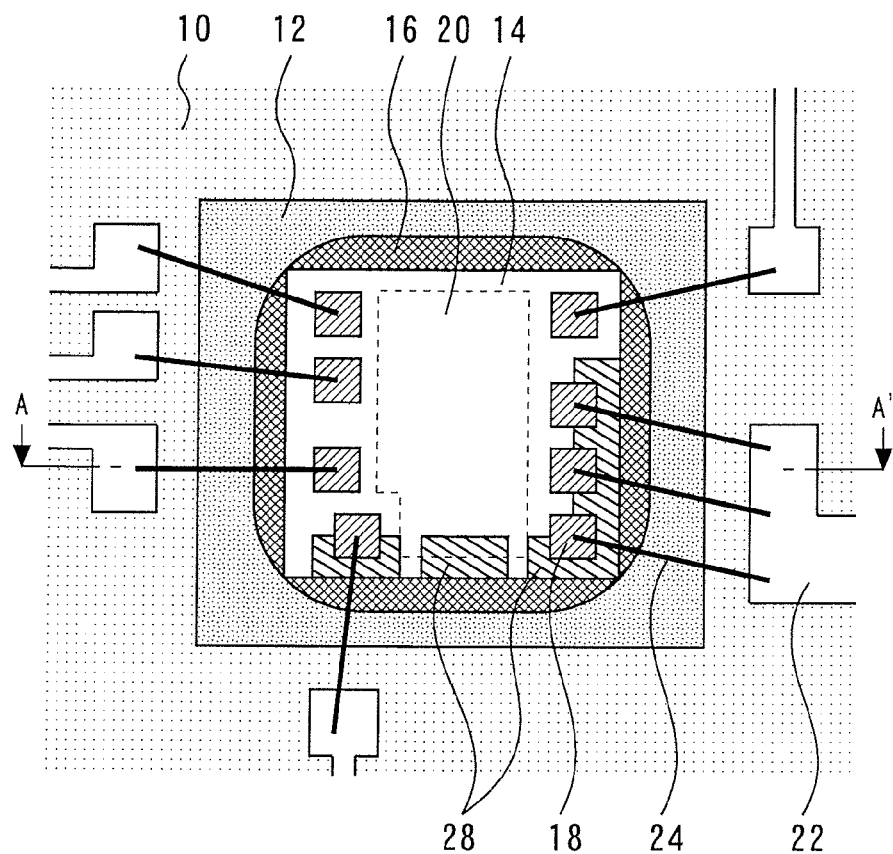
FIG. 1 is a plan view showing the inside of a semiconductor device according to a first embodiment of the present invention.

FIG. 1 is a plan view showing the inside of a semiconductor device according to a first embodiment of the present invention.

Figure 2:
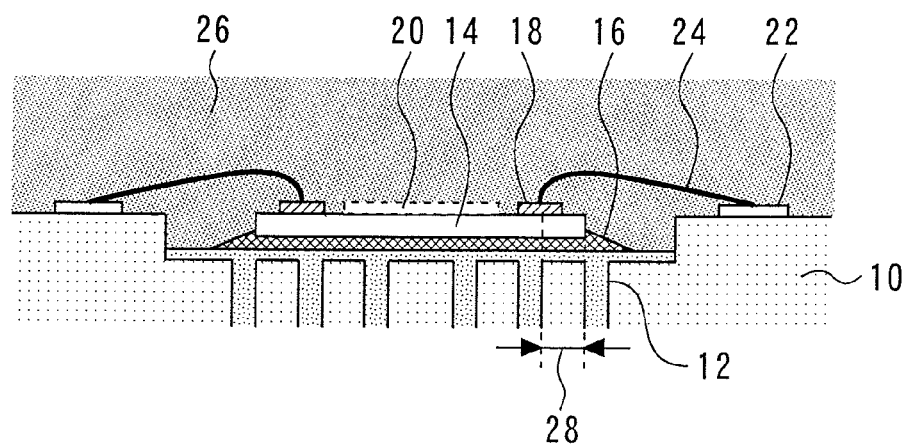
FIG. 2 is a cross-sectional view taken along line A-A' of FIG. 1.

FIG. 2 is a cross-sectional view taken along line A-A' of FIG. 1.

Referring to FIGS. 1 and 2, a grounded die pad 12 is provided on a resin or ceramic printed circuit board 10. A GaAs chip 14 with amplifiers, etc. formed therein is bonded onto the die pad 12 by conductive adhesive 16. Metal electrodes 18 are formed along the edges of the GaAs chip 14, and a device region 20 including semiconductor elements, wires, etc. is formed in the central portion of the GaAs chip 14.

The metal electrodes 18 on the GaAs chip 14 are connected by metal wires 24 to electric circuitry 22 provided on the surface of the printed circuit board 10. The GaAs chip 14 is sealed or encapsulated with a resin 26. It should be noted that in order to reduce the required chip area, the metal electrodes 18 are disposed along and near the chip edges, and the device region 20 extends to near the chip edges. The regions 28 of the surface of the GaAs chip 14 are desired to be prevented from oxidation.

Figure 3:
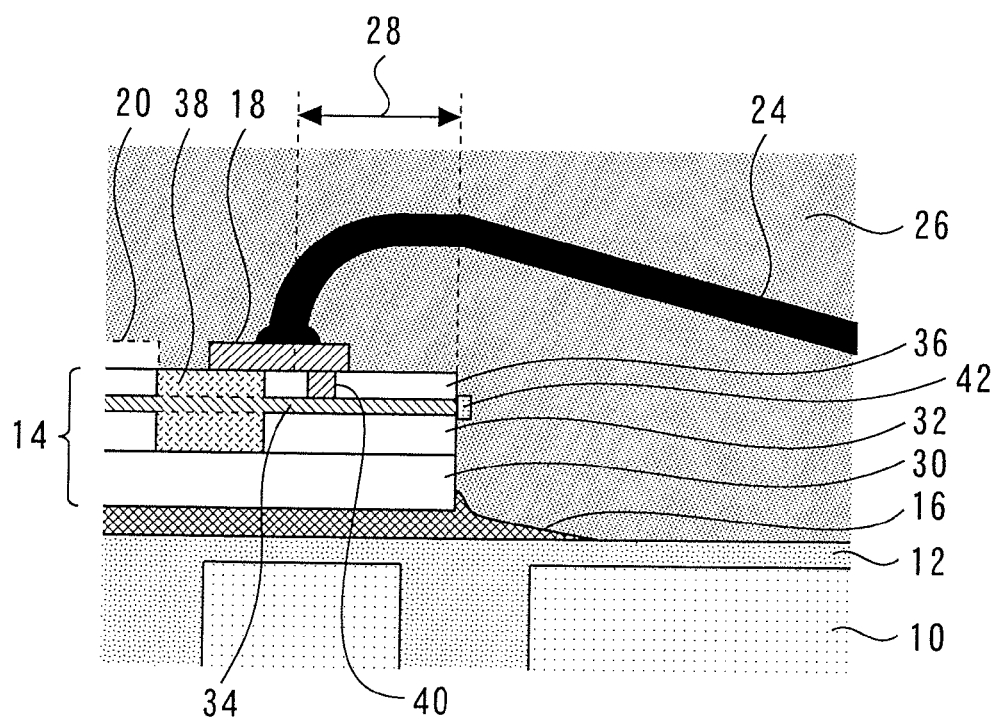
FIG. 3 is an enlarged cross-sectional view of an edge portion of the chip shown in FIG. 2.

FIG. 3 is an enlarged cross-sectional view of an edge portion of the chip shown in FIG. 2. The GaAs chip 14 includes an npn bipolar transistor on a semi-insulating GaAs substrate 30. The npn bipolar transistor includes an n-type GaAs collector layer 32, a p-type GaAs base layer (or simply p-type GaAs layer) 34, and an n-type GaAs emitter layer (or simply n-type GaAs layer) 36 that are sequentially stacked on the semi-insulating GaAs substrate 30. These layers may be formed by epitaxial growth or ion implantation.

The metal electrodes 18 are formed on the n-type GaAs emitter layer 36 along the edges of the GaAs chip 14. A positive voltage is applied to the metal electrodes 18 through the metal wires 24. A semi-insulating region 38 is formed between the metal electrodes 18 and the device region 20 in the central portion of the GaAs chip 14 by ion implantation, and extends through the n-type GaAs collector layer 32, the p-type GaAs base layer 34, and the n-type GaAs emitter layer 36.

According to the present embodiment, a connecting portion 40 is formed outside the semi-insulating region 38 (i.e., near the chip edges), and extends through the n-type GaAs emitter layer 36 to electrically connect the p-type GaAs base layer 34 to the metal electrodes 18.

The advantages of the semiconductor device of the present embodiment will be described by comparing it with the comparative semiconductor device shown in FIG. 4. The comparative semiconductor device does not include the connecting portion 40 of the present embodiment.

Figure 4:
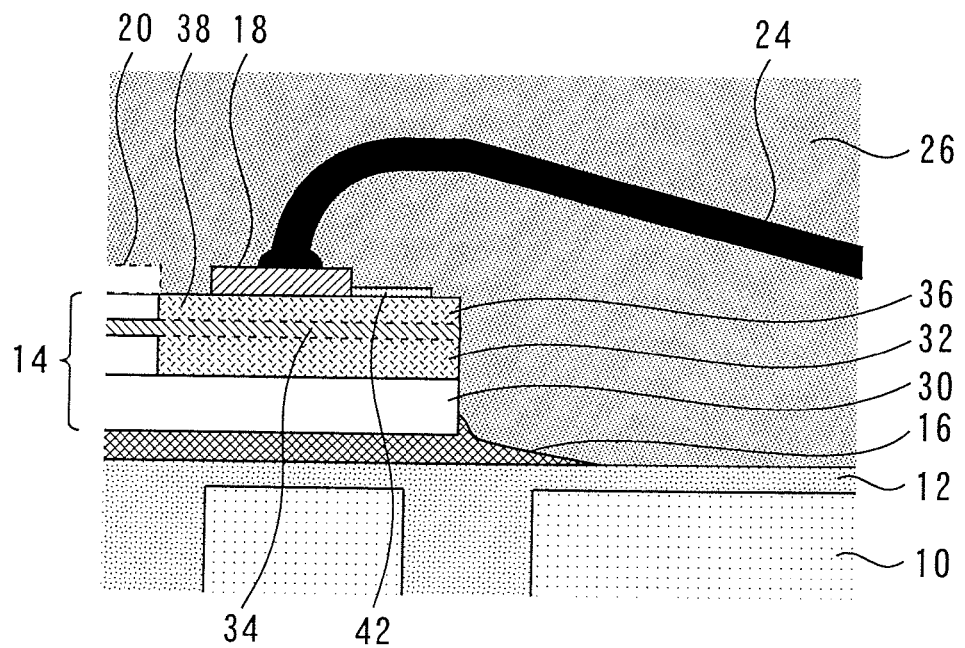
FIG. 4 shows a comparative semiconductor device.

Referring to FIG. 4, in a high temperature and high humidity environment, moisture penetrates into the interior of the semiconductor device through the surface of the resin 26 or along the interface between the resin 26 and the printed circuit board 10, and becomes a solution or solvent containing impurities. As a result, the following cathodic reaction is considered to occur at the grounded die pad 12 due to water ionization:

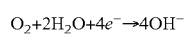

$$O_2 + 2H_2O + 4e^- \rightarrow 4OH^-$$

Further, GaAs has higher ionization tendency than the metal materials, such as Au, used to form the metal electrodes 18 and the wires in the device region 20. Therefore in the case of the comparative semiconductor device, the following anodic reaction is considered to occur at the surface of GaAs chip 14 around the metal electrodes 18 (to which a positive voltage is applied) and around the device region 20:

$$GaAs + 6h^+ \rightarrow Ga^{3+} + As^{3+}$$

The OH⁻ ions generated at the die pad 12 readily reach the GaAs surface near the metal electrodes 18 and react with $Ga^{3+}$ and $As^{3+}$ ions generated by the anodic reaction, forming an oxide (or hydroxide) 42. As a result, the comparative semiconductor device suffers degradations such as damage to the device structure due to volume expansion and formation of a current leakage path.

In the semiconductor device of the present embodiment, on the other hand, the connecting portion 40 disposed outside the semi-insulating region 38 (i.e., near the chip edges) electrically connects between the p-type GaAs base layer 34 and the metal electrodes 18. This means that the positive voltage on the metal electrodes 18 is applied to the p-type GaAs base layer 34 through the connecting portion 40. As a result, the anodic reaction at the p-type GaAs base layer 34 is promoted due to a decrease in the potential barrier between the p-type GaAs base layer 34 and the solution described above (formed by penetrating moisture). On the other hand, the anodic reaction at the n-type GaAs emitter layer 36 is not promoted, or is prevented, since there is an increase in the potential barrier between the n-type GaAs emitter layer 36 and the solution. That is, in the case of the semiconductor device of the present embodiment, when a positive voltage is applied to the metal electrodes 18 with the die pad 12 grounded, an anodic reaction occurs at the sides or edges of the p-type GaAs base layer 34 in the GaAs chip 14 and a cathodic reaction occurs at the die pad 12. Thus, the sides or edges of the GaAs chip 14 (or the p-type GaAs base layer 34) are oxidized in preference to the surface of the GaAs chip 14 around the metal electrodes 18 (to which the positive voltage is applied) and around the device region 20, thus preventing oxidation of the surface of the GaAs chip 14. This prevents degradation and malfunction of the device, thereby increasing the moisture resistance of the GaAs chip.

Second Embodiment

Figure 5:
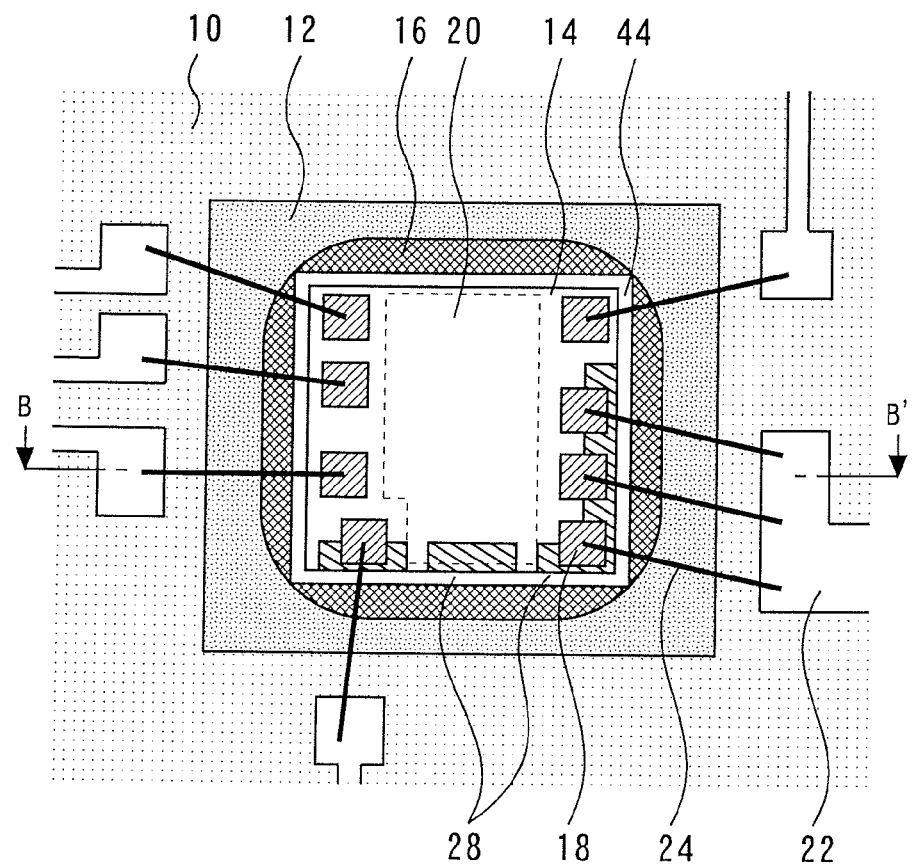
FIG. 5 is a plan view showing the inside of a semiconductor device according to a second embodiment of the present invention.
Figure 6:
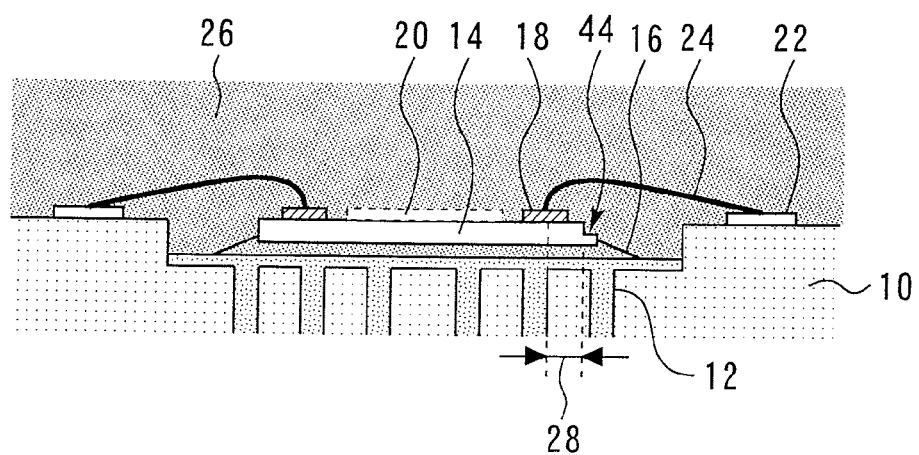
FIG. 6 is a cross-sectional view taken along line B-B' of FIG. 5.
Figure 7:
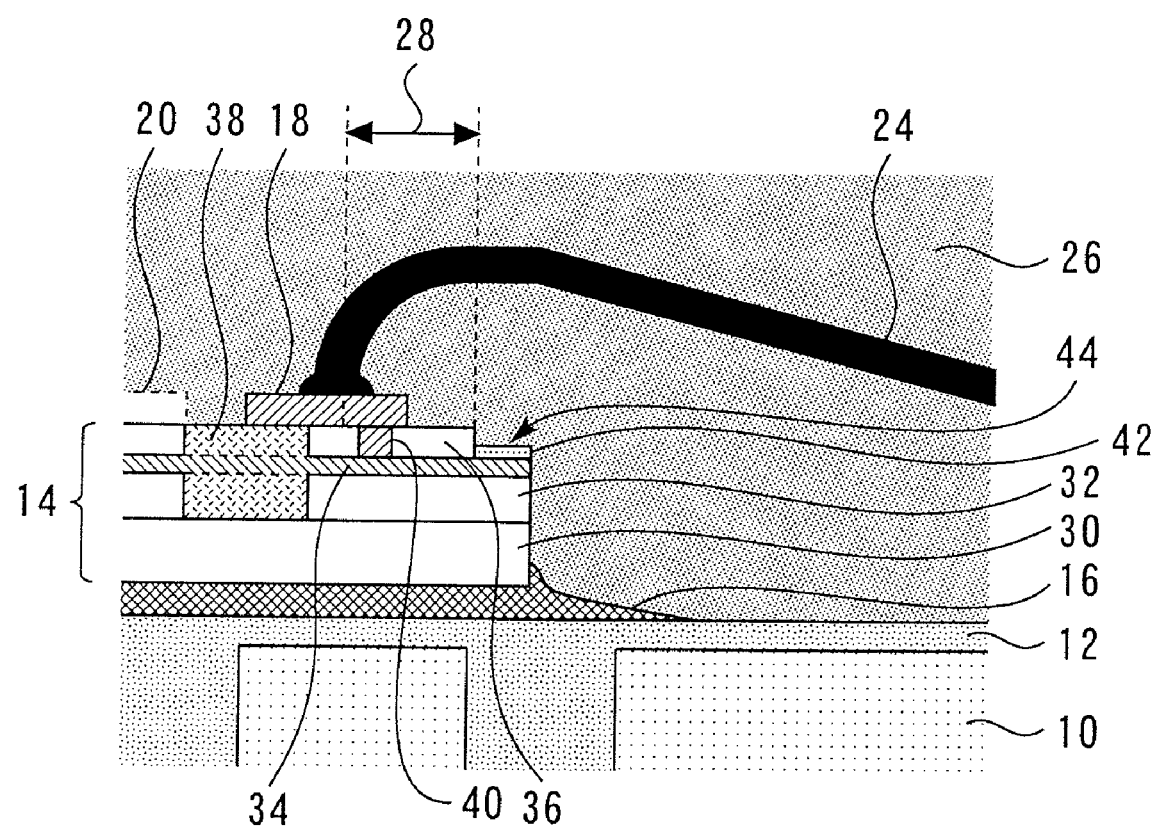
FIG. 7 is an enlarged cross-sectional view of an edge portion of the chip shown in FIG. 6.

FIG. 5 is a plan view showing the inside of a semiconductor device according to a second embodiment of the present invention. FIG. 6 is a cross-sectional view taken along line B-B' of FIG. 5. FIG. 7 is an enlarged cross-sectional view of an edge portion of the chip shown in FIG. 6. It should be noted that those components common to the first embodiment retain the same reference numerals and will not be further described.

The semiconductor device of the present embodiment differs from that of the first embodiment in that the GaAs chip 14 has a step (or cutout portion) 44 formed in its periphery, as shown in FIGS. 5 to 7. More specifically, the step 44 is formed by etching away an edge portion of the n-type GaAs emitter layer 36 outside the semi-insulating region 38. Therefore, in this semiconductor device, the n-type GaAs emitter layer 36 does not cover the edge portion of the p-type GaAs base layer 34, thus increasing the exposed area of the p-type GaAs base layer 34, as shown in FIG. 7. This further promotes the anodic reaction at the p-type GaAs base layer 34 and more effectively prevents oxidation of the surface of the GaAs chip 14, as compared to the first embodiment.

Although in the first and second embodiments the present invention is used to promote the anodic reaction at the p-type GaAs base layer (34) of an npn transistor, it is to be understood that the invention may be applied to a p-type GaAs layer of any suitable semiconductor device. For example, the anodic reaction promoting technique of the present invention may also be applied to the p-type GaAs layer under the n-type GaAs channel layer of an n-type field effect transistor, or applied to the p-type GaAs contact layer or p-type GaAs cladding layer of a pn junction light emitting diode or laser.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-179207, filed on Jul. 9, 2008 including specification, claims, drawings and summary, on which the Convention priority of the present application is based, are incorporated herein by reference in its entirety.

What is claimed is:

1. A semiconductor device comprising:
   a GaAs chip; and
   a resin sealing said GaAs chip, wherein said GaAs chip includes:
      a p-type GaAs layer,
      an n-type GaAs layer on said p-type GaAs layer,
      a metal electrode located on said n-type GaAs layer along an edge of said GaAs chip and to which a positive voltage is applied,
      a device region located in a central portion of said GaAs chip,
      a semi-insulating region located between said metal electrode and said device region and extending in said p-type GaAs layer and said n-type GaAs layer, and
      a connecting portion disposed outside said semi-insulating region and electrically connecting said p-type GaAs layer to said metal electrode.

2. The semiconductor device as claimed in claim 1, wherein said n-type GaAs layer includes a cutout portion located outside said semi-insulating region and exposing a portion of a surface of said p-type GaAs layer.

* * * * *